United States Patent
Yom

(10) Patent No.: US 6,381,291 B1
(45) Date of Patent: Apr. 30, 2002

(54) PHASE DETECTOR AND METHOD

(75) Inventor: Dong Hong Yom, Cupertino, CA (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/161,535

(22) Filed: Sep. 28, 1998

(51) Int. Cl.[7] .............................. H04B 1/10; H03D 3/24; H03D 1/00; H03D 3/02; H03L 7/05
(52) U.S. Cl. ..................... 375/350; 375/376; 331/187; 327/147; 329/325
(58) Field of Search ................... 375/350, 375, 375/348, 346, 373, 376; 331/187, 25, 30, 31; 329/325; 327/147, 156

(56) References Cited

U.S. PATENT DOCUMENTS

| | | | | |
|---|---|---|---|---|
| 5,878,088 A | * | 3/1999 | Knutson et al. | 375/324 |
| 5,943,369 A | * | 8/1999 | Knutson et al. | 375/326 |

* cited by examiner

Primary Examiner—Chi Pham
Assistant Examiner—Khai Tran
(74) Attorney, Agent, or Firm—Duane Morris LLP

(57) ABSTRACT

A novel phase detector for use in a timing recovery circuit of pulse amplitude modulation communication system. A filter internal to the phase detector as preliminary stage for operating on a signal stream of pulse-shaped symbols to reduce pattern-dependent jitter of the output of the phase detector. The filter may have plural taps, delays, multipliers, and summers.

22 Claims, 6 Drawing Sheets

PHASE DETECTOR AND METHOD

BACKGROUND OF THE INVENTION

The present invention relates to phase detectors and, more specifically, relates to phase detectors having a filter for reducing systematic and pattern dependent jitter.

In pulse amplitude modulation (PAM) communication systems, precise symbol timing is essential for reliable performance. Generally, error in circuits for recovering symbol timing is due to temperature drift, aging, and misadjustment. To combat these problems and to correct timing error automatically, a timing recovery circuit such as a phase locked loop may include a sampling unit and a digital timing phase detector.

For digital timing phase detectors, a main source of error in symbol timing is due to systematic or pattern-dependent jitter. Generally, systematic or pattern-dependent jitter occurs as a result of a signal stream of symbols having a sequence or pattern with few signal transitions (e.g., the signal is not periodic in nature). A typical prior art phase detector receiving a completely periodic signal stream (e.g., a clock signal) provides highly accurate timing information. However, for a non-periodic or partially periodic signal stream, the typical prior art detector provides much less meaningful timing information. In multilevel PAM communication systems, systematic or pattern-dependent jitter is specially problematic due to the inherently fewer zero-transitions of a PAM signal stream.

With reference to FIG. 1, in one prior art phase detector for detecting symbol timing by a wave differential method, also known as the Gardner phase detector, the phase detector 20 receives a signal stream of pulse-shaped symbols. Sampler 24 samples the signal stream at twice the symbol rate where $f_s$ is the symbol rate. The three most recent samples are processed and re-sampled at the symbol rate to provide an output signal indicating symbol timing error.

In operation, the first sample in a set of three most recent samples is subtracted from the last sample in the set. The resulting subtracted signal is multiplied by the middle sample to provide an output signal. If the received signal stream of pulse-shaped symbols has zero timing error, the average output of the phase detector 20 is zero. However, even under such ideal conditions the variance of the phase detector output signal is not zero. The non-zero variance is due to the intermediate samples being dependent on adjacent symbols and hence contributing to systematic or pattern-dependent jitter.

With reference to FIG. 2, in another prior art technique, phase detector 30 may include a signal estimator 32 and a subtractor 34. The estimator 32 estimates the influence of adjacent symbols on intermediate samples. The subtractor 34 subtracts the output of the estimator 32 from the intermediate samples to reduce the effect of systematic and pattern dependent jitter on the output signal of the phase detector 30.

Accordingly, it is an object of the present invention to provide a novel phase detector including a filter for filtering a received signal stream of symbol before symbol timing is extracted.

It is another object of the present invention to provide a novel filter for operating on a received signal stream of pulse-shaped symbols to thereby provide a filtered received signal to a phase detector for reducing pattern dependent jitter of the phase detector.

It is yet another object of the present invention to provide a novel PAM communication system having a receiver including a phase detector for providing accurate symbol timing information with less pattern-dependent jitter.

It is still another object of the present invention to provide a novel receiver including a phase detector having a filter for increasing the periodicity of a received signal stream of pulse-shaped symbols before symbol timing is extracted from the signal stream.

It is a further object of the present invention to provide a novel method for reducing pattern-dependent jitter in the output of a phase detector.

It is yet a further object of the present invention to provide a novel phase locked loop having a filter for filtering a received signal stream of pulse-shaped symbols as an initial stage before phase detection.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
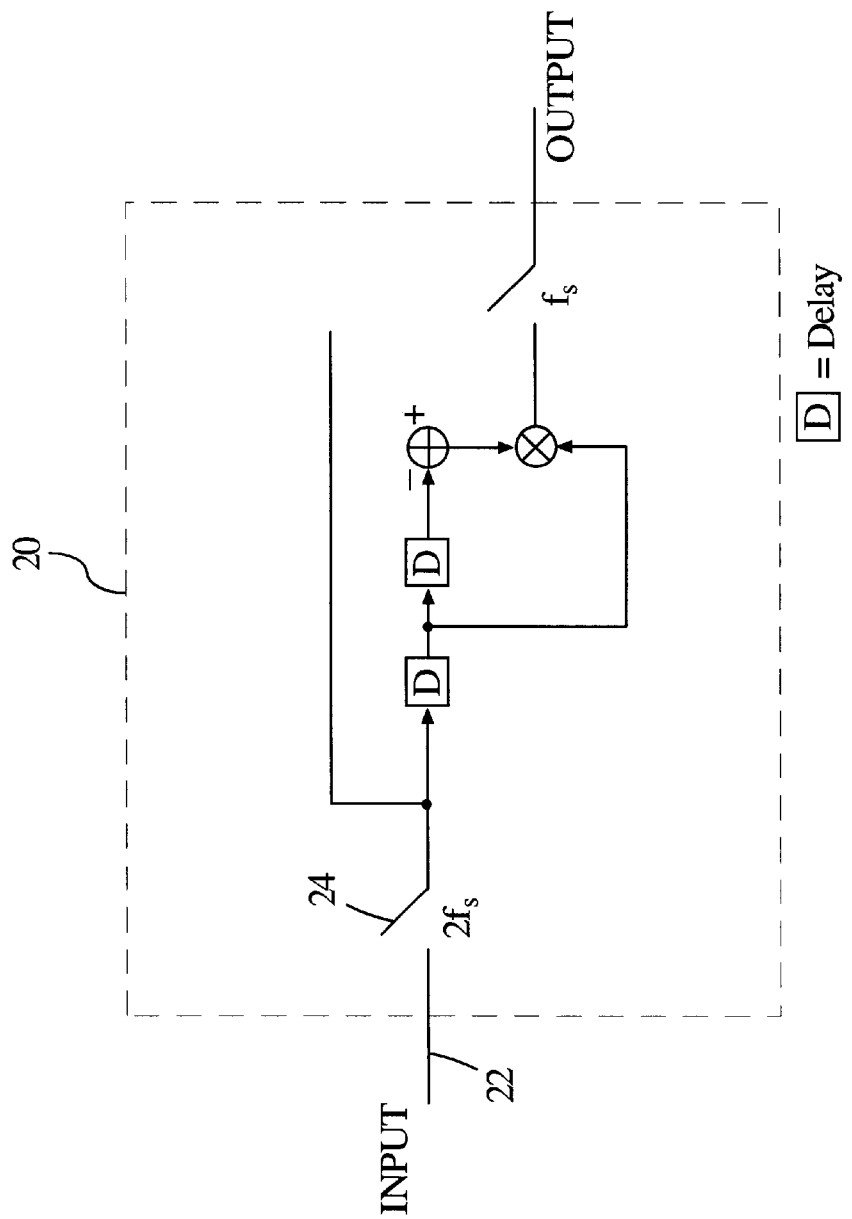
FIG. 1 is a functional block diagram illustrating a first prior art phase detector.
Figure 2:
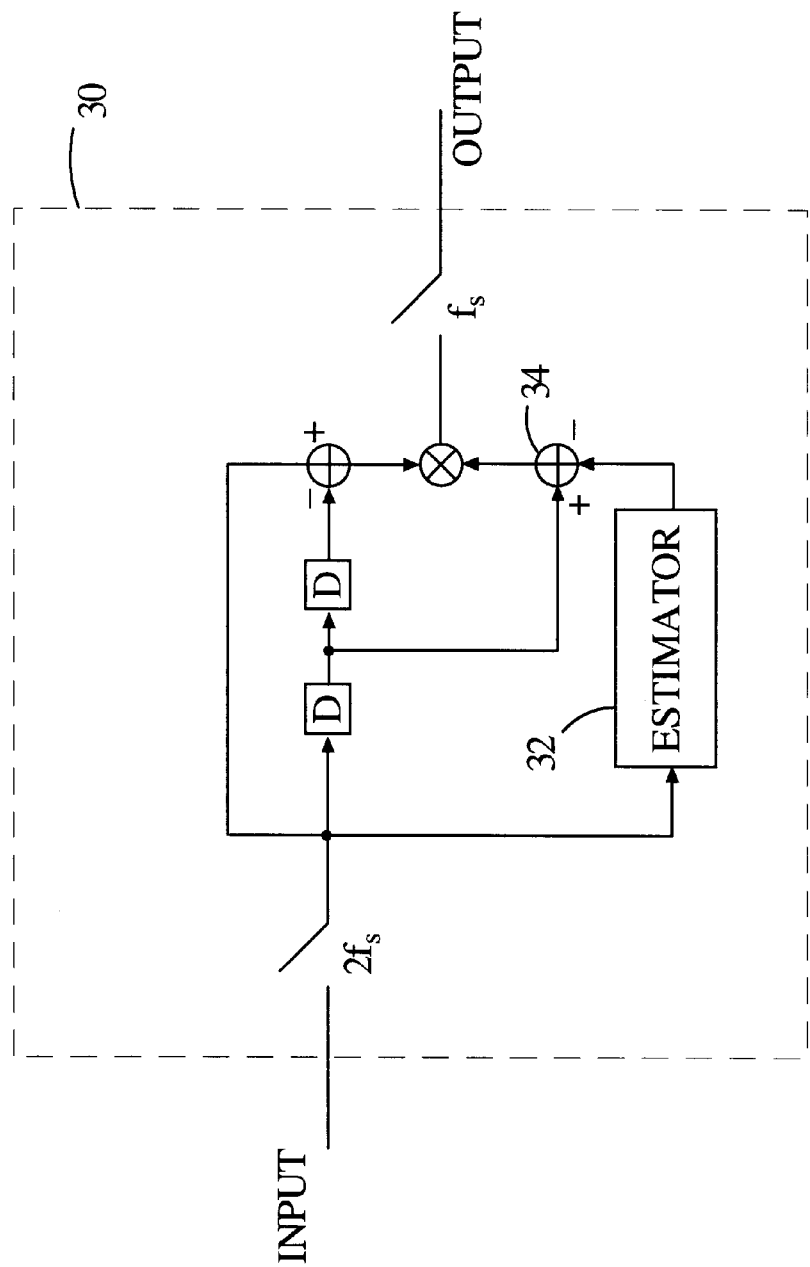
FIG. 2 is a functional block diagram illustrating a second prior art phase detector.
Figure 3:
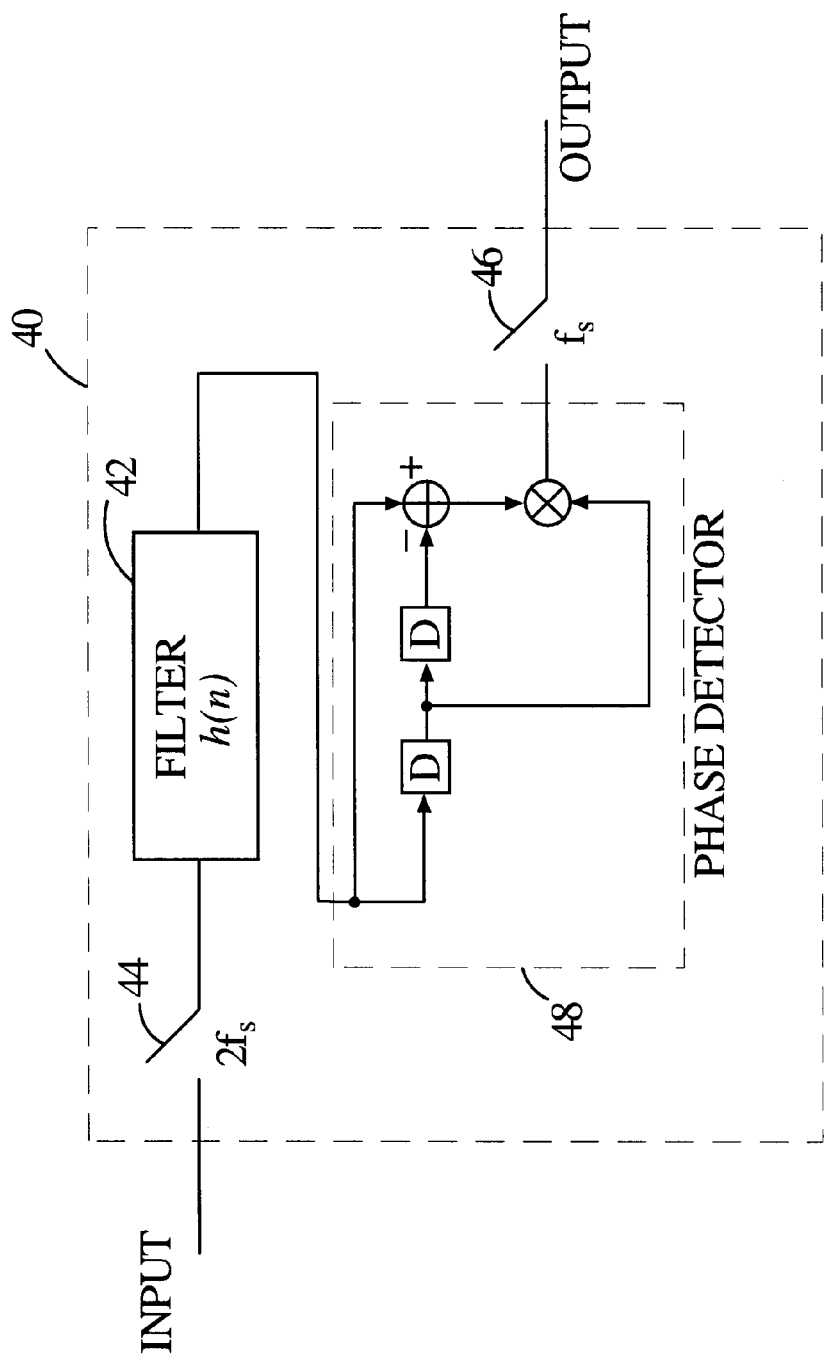
FIG. 3 is a function block diagram illustrating an embodiment of a phase detector of the present invention.

With reference to FIG. 3, a phase detector 40 may include filter 42, input sampler 44, output sampler 46, and a Gardner phase detector 48. The input sampler 44 or output sampler 46 may be external to the phase detector 40.

In operation, a signal stream of pulse-shaped symbols are sampled at twice the symbol rate by input sampler 44 to provide a received signal stream of samples x(n). The filter h(n) 42 operates on the received signal stream of samples x(n) to provide an output signal stream of samples y(n) that is generally zero every $1/f_s$ seconds (y(n)=x(n) * h(n), where * is the convolution operator). The output y(n) of filter 42 is then provided to the Gardner detector 48 to detect timing information. The Gardner phase detector 48 may provide an output signal at the symbol rate.

In typical PAM communication systems, to reduce intersymbol interference, a signal stream of symbols is pulse-shaped with a pulse-shaping filter such as a "raised cosine" filter or a Nyquist filter. Typically, pulse-shaping to reduce intersymbol interference is partially performed at a transmitter with the remainder of the pulse shaping being performed at a receiver. The impulse response of the pulse-shaping filter may be represented by g(t) and g(n) is the sampled version of g(t) at twice the symbol rate.

The unit sample response of the filter 42 may be:

$$h(n)=g(n)\cos(\pi n)=g(n)(e^{j\pi n}+e^{-j\pi n})/2 \qquad (1)$$

where n is integer and g(n) is a sampled version at twice the symbol rate of the impulse response of the combined transmit and receive pulse shapers.

Figure 4:
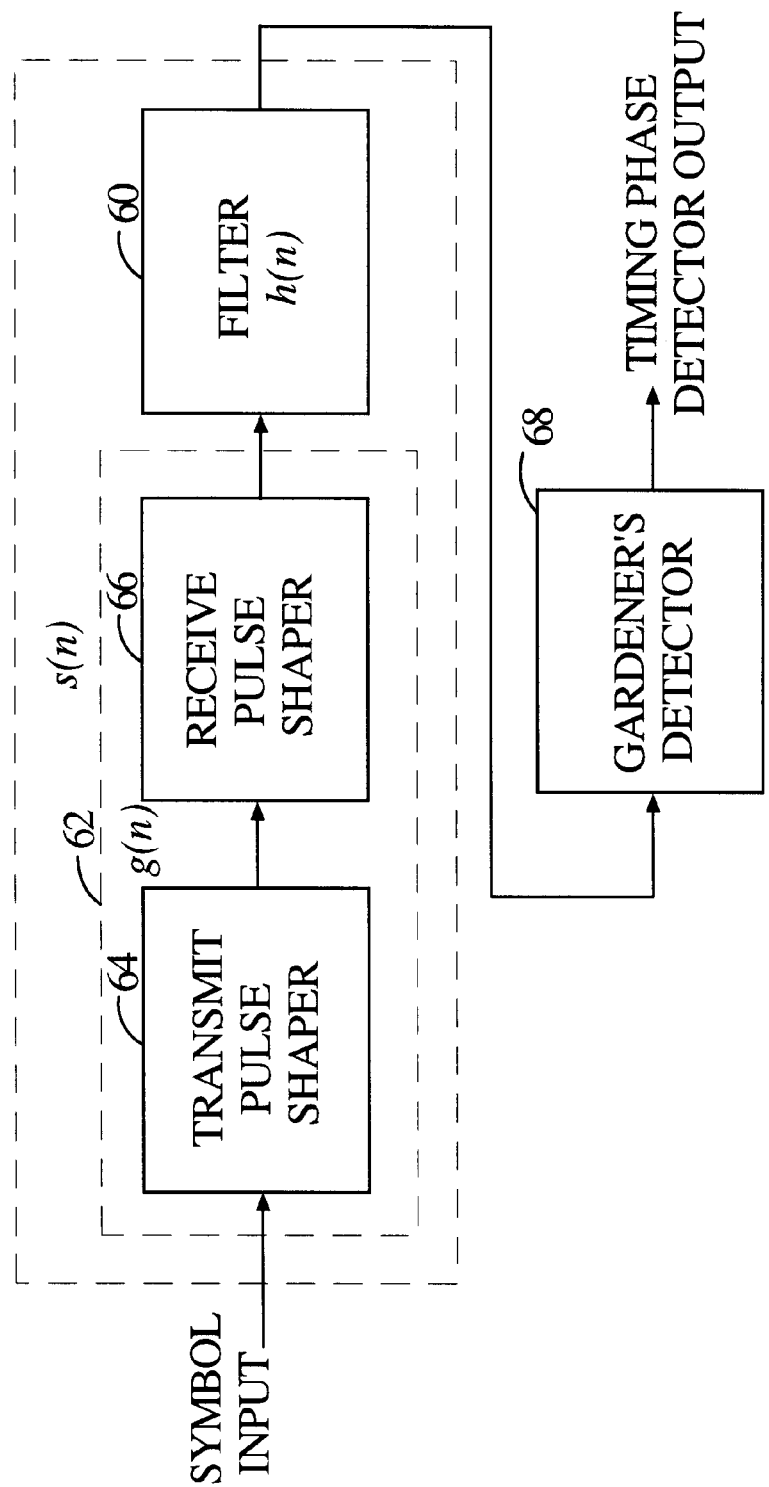
FIG. 4 is a functional block diagram illustrating an embodiment of a communication system of the present invention.

With reference to FIG. 4, a PAM communication having symbol timing detection may include a Gardner phase detector 68, filter 60, and pulse shaper 62. The pulse shaper 62 may include a transmit pulse shaper 64 located in a transmitter and a receive pulse shaper 66 located in a receiver.

In operation, a signal stream of symbols may be operated on by the pulse shaper 62 and filter 60. Together, the unit sample response of the pulse shaper 62 and filter 60 is s(n), where the equation for s(n) may also be expressed as:

$$s(n) = g(n) * h(n) = g(n) * (g(n)e^{j\pi n} + g(n)e^{-j\pi n})/2 \qquad (2)$$

$$= g(n) * (g(n)e^{j\pi n})/2 + g(n) * (g(n)e^{-j\pi n})/2$$

$$= e^{j\pi n/2}((g(n)e^{-j\pi n/2})/2) +$$

$$e^{-j\pi n/2}((g(n)e^{j\pi n/2}) * (g(n)e^{-j\pi n/2})/2)$$

$$= ((g(n)e^{-j\pi n/2}) * (g(n)e^{j\pi n/2}))(e^{j\pi n/2} + e^{-j\pi n/2})/2$$

$$= ((g(n)e^{-j\pi n/2}) * (g(n)e^{j\pi n/2}))\cos(\pi n/2).$$

In equation (2), "$\cos(\pi n/2)$" causes s(n) to be zero every $1/f_s$ seconds. The output of filter 60 will be zero every $1/f_s$ seconds because symbol input rate is also $1/f_s$ seconds. Therefore, under ideal channel conditions and zero phase error, the output signal of the phase detector will have an average value of zero with zero variance.

In a PAM communication system having pulse-shaping means for pulse-shaping a signal stream of symbols having a "raised-cosine" filter to prevent intersymbol interference among the symbols, the impulse response of the "raised-cosine" filter may generally be expressed as:

g(t)=sinc(t/T)(cos($\alpha\pi$t/T)/(1−(2$\alpha$t/T)$^2$))

where t is time, T is a constant representing the symbol period, and $\alpha$ is a real constant between 0 and 1. The selection of $\alpha$ is a design choice. The sampled version of g(t) at twice the symbol rate is:

g(n)=sinc(n/2)(cos($\alpha\pi$n/2)/(1−($\alpha$n)$^2$))

The impulse response of filter h(n) may then be:

h(n)=sinc(n/2)(cos($\alpha\pi$n/2)/(1−($\alpha$n)$^2$))cos($\pi$n)   (3)

In general, h(n) has infinite duration. For practical implementation, the duration may be truncated to be finite. Then h(n) may be:

h(n)=g(n)cos($\pi$n)w(n)   (4)

where w(n) is a rectangular window function. The window function w(n) can be expressed as:

$$w(n) = \sum_{k=-L}^{L} \delta(n-k)$$

where $\delta$(n) is a unit sample function, L is a positive integer constant, and 2L+1 is the duration of w(n). For the case of "raised cosine" pulse-shaping, h(n) may be:

h(n)=sinc(n/2)(cos($\alpha\pi$n/2)/(1−($\alpha$n)$^2$))cos($\pi$n)w(n)   (5)

Figure 5:
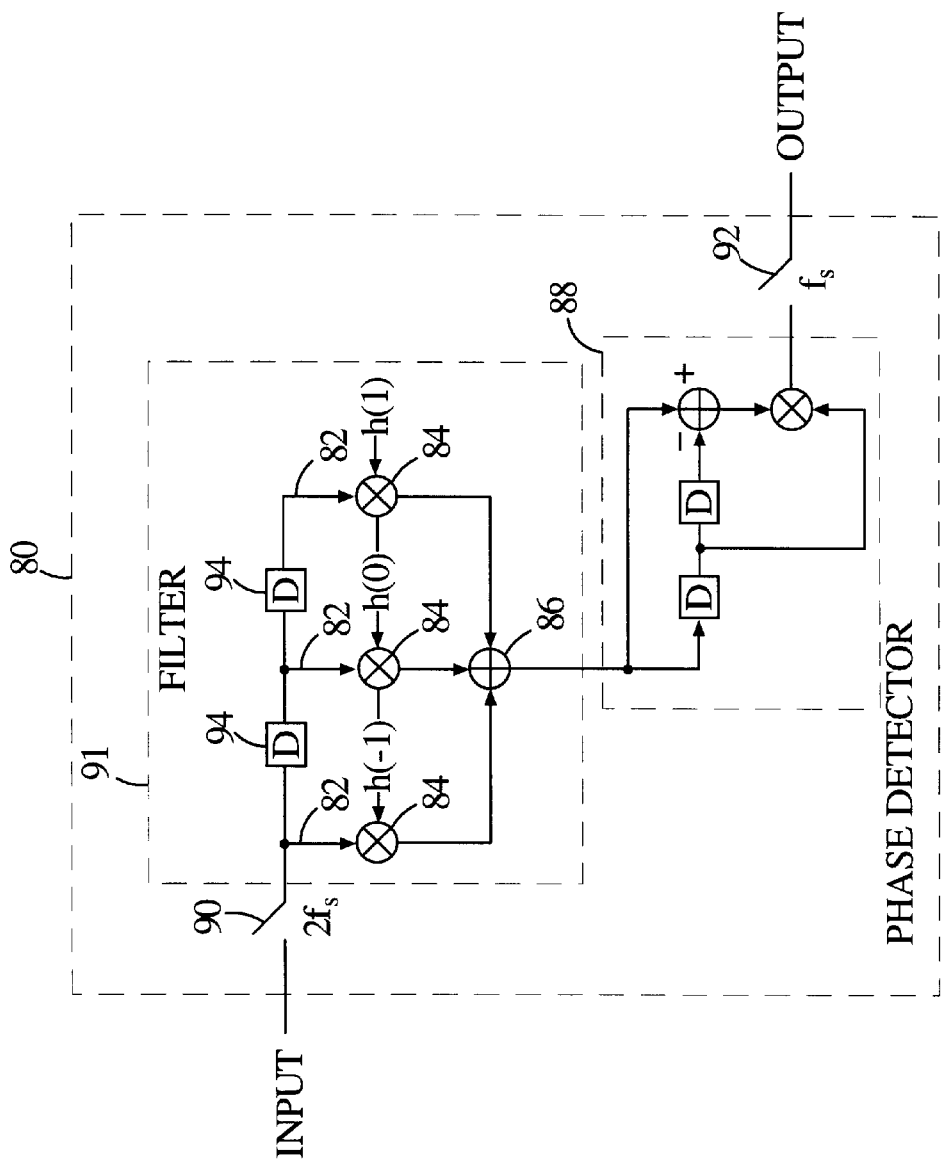
FIG. 5 is a functional block diagram illustrating an embodiment of a filter inside a phase detector of the present invention.

With reference to FIG. 5, phase detector 80 may include input sampler 90, filter 91, Gardner detector 88, and output sampler 92. The filter 91 may include plural taps 82, plural multipliers 84, a summer 86, and plural delays 94. Input sampler 90 and output sampler 92 may be internal or external to the phase detector 80. Filter 91 is an implementation of equation (4) with L=1.

In operation, input sampler 90 receives and samples at twice the symbol rate a signal stream of symbols which have been shaped with a "raised cosine" filter g(t). A series of samples may be stored in the delays 94. Each tap 82 may receive one of the stored samples and provides the stored sample to one of the multipliers 84. Each multiplier 84 may receive one stored sample and multiply the sample with a value of h(n). The multiplied signal from each multiplier 84 is then provided to summer 86. The sum of the multiplied signal is then provided to the Gardner phase detector 88. FIG. 5 illustrates a three tap embodiment (i.e., L=1) as an example. Preferably, the phase detector may be implemented with eleven or more taps.

Figure 6:
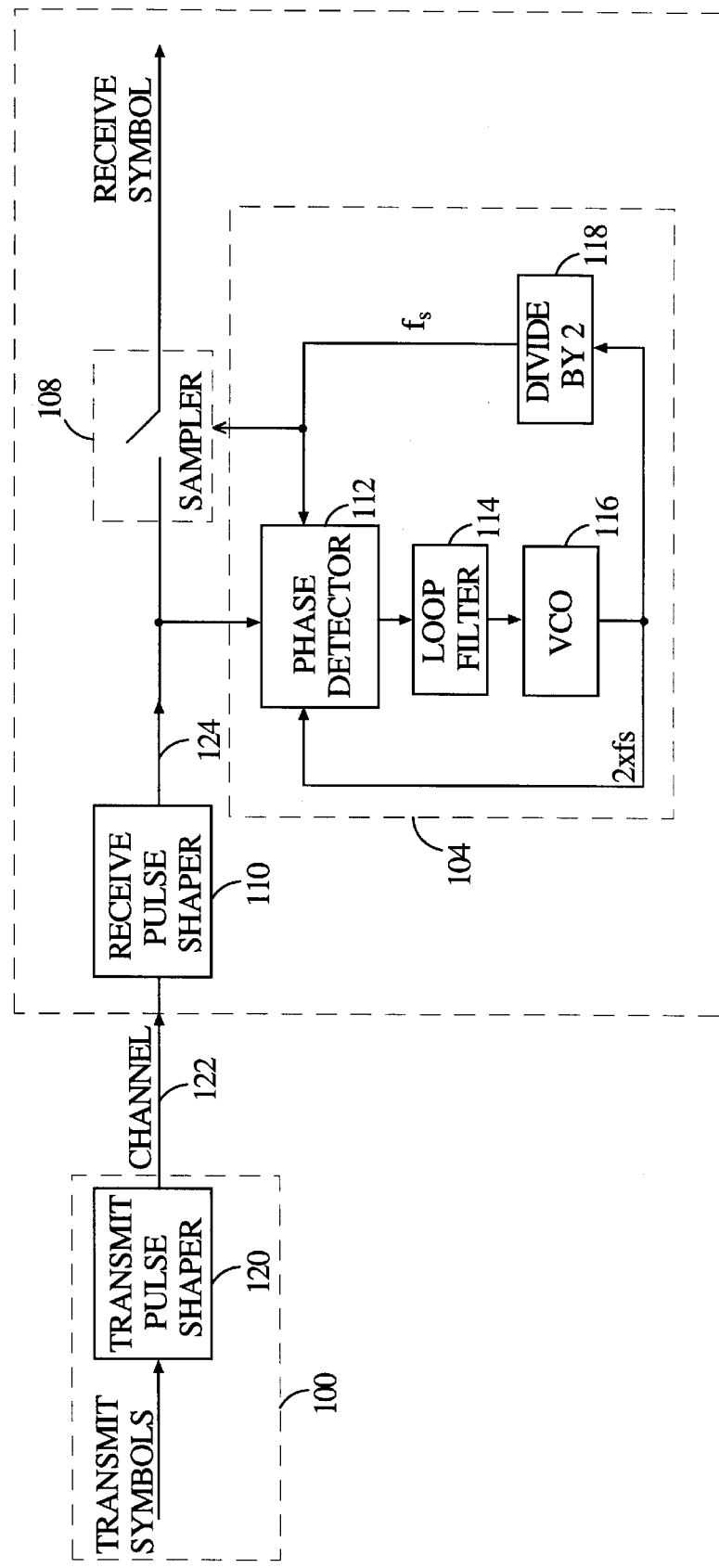
FIG. 6 is a functional block diagram illustrating an embodiment of a PAM communication system of the present invention.

With reference to FIG. 6, a PAM communication system may include a transmitter 100 and a receiver 102. The receiver 102 may include a timing recovery circuit 104, a sampler 108, and a receive pulse shaper 110. The timing recovery circuit 104 may include a phase detector 112, a loop filter 114, a voltage controlled oscillator 116, and a frequency divider 118. The transmitter 100 may include a transmit pulse shaper 120 and means for providing a signal stream of symbols (not shown).

In operation, a signal stream of symbols are received by the transmit pulse shaper 120. The transmit pulse shaper 120 shapes the signal stream of symbols. The transmitter 100 transmits the signal stream of pulse-shaped symbol through the channel 122. The receiver 102 receives the signal stream of pulse-shaped symbols.

In the receiver, the receive pulse shaper 110 pulse-shapes the received signal stream. Together the operation of the transmit pulse shaper 120 and the receive pulse shaper 110 result in pulse-shaping the signal stream of symbols with a pulse-shaping filter such as the "raised-cosine" filter to provide a received signal stream of pulse-shaped symbols having no intersymbol interference under ideal conditions. Sampler 108 samples the received signal stream of pulse-shaped symbols at the symbol rate to recover the transmitted symbols. The received signal stream of pulse-shaped symbols may be provided to the phase detector 112. The phase detector 112 may be one of the phase detectors illustrated in FIGS. 3 or 5. The phase detector 112 produces an output signal indicating the phase offset of sampled symbols. The output of the phase detector 112 may be received by loop filter 114 to average the phase detector output. The output of the loop filter 114 may be supplied to the voltage controlled oscillator 116. The voltage controlled oscillator 116 generates a timing signal at twice the symbol rate. The timing signal generated by the voltage controlled oscillator 116 is provided to the phase detector 112 and the timing signal is also provided to the frequency divider 118 to generate a timing signal at the symbol rate. The timing signal at the symbol rate generated by the frequency divider 118 is provided to the phase detector 112. This timing signal is also provided to the sampler 108 to trigger the sampling of the received signal stream. The output of the sampler 108 is expected to be the symbol which had been transmitted by the transmitter.

For quadrature amplitude modulation applications, outputs of the I and Q phase detectors are combined through addition into one signal.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a communication system having pulse shaping means for pulse-shaping a signal stream of symbols having a symbol rate to provide a signal stream of pulse-shaped symbols having substantially no intersymbol interference, a phase detector comprising:
   (i) input means for receiving the signal stream of pulse-shaped symbols and for sampling at twice the symbol rate;
   (ii) a filter for shaping the received signal stream over time by a function h(n), where $$h(n)=g(n)\cos(\pi n),$$

g(n) is an impulse response of the pulse-shaping means and n= ..., −3, −2, −1, 0, 1, 2, 3 ...; and
   (iii) determining means for determining symbol timing of the filtered signal stream.

2. The phase detector of claim 1 wherein said determining means comprises a Gardner phase detector.

3. The phase detector of claim 1 wherein said determining means includes means for determining symbol timing of the filtered signal stream by a wave differential method.

4. In a communication system having a raised cosine filter for pulse-shaping a signal stream of symbols having a symbol rate to provide a signal stream of pulse-shaped symbols having substantially no intersymbol interference, a phase detector comprising:
   (i) input means for receiving the signal stream of pulse-shaped symbols and for sampling at twice the symbol rate;
   (ii) a filter for shaping the received signal stream over time by a function h(n), where $$h(n)=\text{sinc}(n/2)(\cos(\alpha\pi n/2)/(1-(\alpha n)^2))\cos(\pi n),$$

α is a real constant between 0 and 1, and
   n= ..., −3, −2, −1, 0, 1, 2, 3, ...; and
   (iii) determining means for determining symbol timing of the filtered signal stream.

5. The phase detector of claim 4 wherein said determining means comprises a Gardner phase detector.

6. The phase detector of claim 4 wherein said determining means includes means for determining symbol timing of the filtered signal stream by a wave differential method.

7. In a communication system having pulse shaping means for pulse-shaping a signal stream of symbols having a symbol rate to provide a signal stream of pulse-shaped symbols having substantially no intersymbol interference, a phase detector comprising:
   (i) input means for receiving the signal stream of pulse-shaped symbols and for sampling at twice the symbol rate;
   (ii) a filter for shaping the received signal stream over time by a function h(n), where $$h(n)=g(n)\cos(\pi n)\,w(n),$$

$$w(n) = \sum_{k=-L}^{L} \delta(n-k),$$

g(n) is an impulse response of the pulse-shaping means, L is a positive integer constant, and
   n= ..., −3, −2, −1, 0, 1, 2, 3, ...; and
   (iii) determining means for determining symbol timing of the filtered signal stream.

8. The phase detector of claim 7 wherein said determining means comprises a Gardner phase detector.

9. The phase detector of claim 7 wherein said determining means includes means for determining symbol timing of the filtered signal stream by a wave differential method.

10. In a communication system having a raised cosine filter for pulse-shaping a signal stream of symbols having a symbol rate to provide a signal stream of pulse-shaped symbols having substantially no intersymbol interference, a phase detector comprising:
    (i) input means for receiving the signal stream of pulse-shaped symbols and for sampling at twice the symbol rate;
    (ii) a filter for shaping the received signal stream overtime by a function h(n), where $$h(n)=\text{sinc}(n/2)(\cos(\alpha\pi n/2)/(1-(\alpha n)^2))\cos(\pi n)w(n),$$

$$w(n) = \sum_{k=-L}^{L} \delta(n-k),$$

α is a real constant between 0 and 1,
    L is a positive integer constant, and
    n= ..., −3, −2, −1, 0, 1, 2, 3, ...; and
    (iii) determining means for determining symbol timing of the filtered signal stream.

11. The phase detector of claim 10 wherein said determining means comprises a Gardner phase detector.

12. The phase detector of claim 10 wherein said determining means includes means for determining symbol timing of the filtered signal stream by a wave differential method.

13. In a pulse amplitude modulation communication system having pulse shaping means for pulse-shaping a signal stream having a symbol rate of symbols to provide a signal stream of pulse-shaped symbols having substantially no intersymbol interference, a filter comprising:
    an input terminal adapted to receive as an input signal a signal stream of pulse-shaped symbols for sampling at twice the symbol rate;
    delay means for providing 2L+1 selectively delayed versions of the input signal;
    2L+1 taps each operatively connected to receive one of the 2L+1 selectively delayed versions of the input signal;
    2L+1 multipliers each operatively coupled to one of said 2L+1 filter taps for multiplying each one of the 2L+1 selectively delayed versions of the input signal by a corresponding value of h(n) to thereby produce a product signal,
    means for providing an impulse response of said pulse shaping means sampled at twice the symbol rate g(n), where $$h(n)=g(n)\cos(\pi n)w(n),$$

$$w(n) = \sum_{k=-L}^{L} \delta(n-k),$$

α is a real constant between 0 and 1, and
    L is a positive integer constant; and
    summing means operatively coupled to said 2L+1 multipliers for summing the product signals therefrom.

14. In a pulse amplitude modulation communication system having a raised cosine filter for pulse-shaping a signal stream of symbols having a symbol rate to provide a signal stream of pulse-shaped symbols having substantially no intersymbol interference, a filter comprising:

an input terminal adapted to receive as an input signal a signal stream of pulse-shaped symbols for sampling at twice the symbol rate;

delay means for providing 2L+1 selectively delayed versions of the input signal;

2L+1 filter taps each operatively connected to receive one of the 2L+1 selectively delayed versions of the input signal;

2L+1 multipliers each operatively coupled to one of said 2L+1 filter taps for multiplying each one of the 2L+1 selectively delayed versions of the input signal by a corresponding value of h(n) to thereby provide a product signal, where h(n)=sinc(n/2)(cos(απn/2)/(1−(αn)$^2$))cos(πn) w(n), $$w(n) = \sum_{k=-L}^{L} \delta(n-k),$$

α is a real constant between 0 and 1, and
L is a positive integer constant; and summing means operatively coupled to said 2L+1 multipliers for summing the product signals therefrom.

15. In a pulse amplitude modulation communication system having pulse shaping means for pulse-shaping a signal stream of symbols having a symbol rate to provide a signal stream of pulse-shaped symbols having no intersymbol interference, a method of reducing symbol timing jitter, comprising the steps of:

(a) sampling a signal stream of pulse-shaped symbols at twice the symbol rate to provide an input signal;

(b) providing 2L+1 selectively delayed versions of the input signal;

(c) multiplying each one of the 2L+1 selectively delayed versions of the input signal by a corresponding value of h(n), including the step of providing an impulse response of said pulse shaping means sampled at twice the symbol rate g(n), where h(n)=g(n)cos(πn) w(n), $$w(n) = \sum_{k=-L}^{L} \delta(n-k),$$

α is a real constant between 0 and 1, and
L is a positive integer constant; and (d) summing the product of the multiplied signals.

16. In a pulse amplitude modulation communication system having a raised cosine filter for pulse-shaping a signal stream of symbols having a symbol rate to provide a signal stream of pulse-shaped symbols having no intersymbol interference, a method of increasing the periodicity of the signal stream of pulse-shaped symbols, comprising the steps of:

(a) sampling a signal stream of pulse-shaped symbols at twice the symbol rate to thereby provide an input signal;

(b) providing 2L+1 selectively delayed versions of the input signal;

(c) multiplying each one of the 2L+1 selectively delayed versions of the input signal by a corresponding value of h(n), where )=sinc(n/2)(cos(απn/2)/(1−(αn)$^2$))cos(πn)w    (5)

$$w(n) = \sum_{k=-L}^{L} \delta(n-k),$$

α is a real constant between 0 and 1, and
L is a positive integer constant; and (d) summing the product of the multiplied signals.

17. A pulse symbol communication system comprising:

(i) pulse-shaping means for pulse-shaping a signal stream of pulse symbols to provide a signal stream of pulse-shaped symbols having substantially no intersymbol interference; and (ii) receiving means for receiving the signal stream of pulse-shaped symbols, said receiving means including a phase detector for extracting symbol timing information from the signal stream of pulse-shaped symbols, said phase detector having a filter for shaping the received signal stream over time as a function h(n), where h(n)=g(n)cos(πn), n= . . . , −3, −2, −1, 0, 1, 2, 3, . . . , and
g(n) is an impulse response of the pulse-shaping means.

18. The system of claim 17 wherein said phase detector includes means for extracting symbol timing information by a wave differential method.

19. In a communication system having pulse-shaping means for pulse-shaping a signal stream of pulse symbols to provide a signal stream of pulse-shaped symbols having substantially no intersymbol interference, a receiver comprising:

(i) receiving means for receiving a signal stream of pulse-shaped symbols; and (ii) a phase detector for extracting symbol timing information form the received signal stream of pulse-shaped symbols, said phase detector having a filter for shaping the received signal stream over time by a function h(n), where h(n)=g(n)cos(πn), g(n) is an impulse response of the pulse-shaping means, and
n= . . . , −3, −2, −1, 0, 1, 2, 3, . . . .

20. The system of claim 19 wherein said phase detector includes means for extracting symbol timing information by a wave differential method.

21. In a communication system having (i) pulse-shaping means for pulse-shaping a signal stream of pulse symbols to provide a signal stream of pulse-shaped symbols having substantially no intersymbol interference, and (ii) receiving means for receiving a signal stream of pulse-shaped symbols, a phase locked loop comprising:

a phase detector for extracting symbol timing information from the received signal, said phase detector having a filter for filtering the received signal stream over time by a function h(n), where:

h(n)=g(n)cos(πn), g(n) is an impulse response of the pulse-shaping means, and
n= . . . , −3, −2, −1, 0, 1, 2, 3, . . . ; and a voltage controlled oscillator for generating a control signal as function of the extracted symbol timing information.

22. The phase locked loop of claim 21 wherein said phase detector includes means for extracting symbol timing information by a wave differential method.

* * * * *